US012696703B2

(12) United States Patent
Abdulla Al Galib et al.

(10) Patent No.: US 12,696,703 B2
(45) Date of Patent: Jul. 28, 2026

(54) BOW MITIGATION IN HIGH ASPECT RATIO OXIDE AND NITRIDE ETCHES

(71) Applicant: Applied Materials, Inc., Santa Clara, CA (US)

(72) Inventors: Mir Abdulla Al Galib, Sunnyvale, CA (US); Sonam Dorje Sherpa, San Ramon, CA (US); Kenji Takeshita, Sunnyvale, CA (US); Alok Ranjan, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 481 days.

(21) Appl. No.: 18/482,384

(22) Filed: Oct. 6, 2023

(65) Prior Publication Data

US 2025/0118570 A1 Apr. 10, 2025

(51) Int. Cl.
H10P 50/00 (2026.01)
H10P 76/40 (2026.01)

(52) U.S. Cl.
CPC ............ H10P 50/73 (2026.01); H10P 76/405 (2026.01); H10P 76/4085 (2026.01)

(58) Field of Classification Search
None
See application file for complete search history.

(56) References Cited

U.S. PATENT DOCUMENTS

2015/0311087 A1 10/2015 Simsek-ege et al.
2016/0020211 A1 1/2016 Yang et al.

2017/0207088 A1* 7/2017 Kwon ................... H10P 50/283
2019/0214269 A1 7/2019 Hama et al.
2022/0246440 A1 8/2022 Kumakura et al.

FOREIGN PATENT DOCUMENTS

TW 201438098 A 10/2014
TW 201911406 A 3/2019
TW 202215495 A 4/2022
WO 2008015212 A1 2/2008

OTHER PUBLICATIONS

PCT/US2024/049751, "International Search Report and Written Opinion", Jan. 8, 2025, 10 pages.
Taiwanese Application No. 113137916, Office Action mailed on Apr. 25, 2025, 10 pages (1 page of English Translation and 9 pages of original document).

* cited by examiner

*Primary Examiner* — Roberts P Culbert

(74) *Attorney, Agent, or Firm* — Kilpatrick Townsend & Stoctkon LLP

(57) ABSTRACT

Methods of semiconductor processing may include forming plasma effluents. The plasma effluents may then contact a carbon-containing hardmask and an oxide cap. The plasma effluents can etch one or more features in the oxide cap through one or more apertures of the carbon-containing hardmask. Etching can create a tapered profile for one or more features in the oxide cap. The one or more features can be characterized by a critical dimension at the bottom of the one or more features. The critical dimension can be less than or about 80% of a width of the one or more apertures.

20 Claims, 5 Drawing Sheets

200

202
Etch mask and oxide cap

204
Form plasma effluents

206
Contact mask and oxide cap with plasma effluents

208
Etch oxide cap to create a tapered profile

210
Etch oxide and nitride layers

200

202

Etch mask and oxide cap

204

Form plasma effluents

206

Contact mask and oxide cap with plasma effluents

208

Etch oxide cap to create a tapered profile

210

Etch oxide and nitride layers

BOW MITIGATION IN HIGH ASPECT RATIO OXIDE AND NITRIDE ETCHES

TECHNICAL FIELD

The present technology relates to semiconductor systems, processes, and equipment. More specifically, the present technology relates to etching processes in semiconductor fabrication.

BACKGROUND

Integrated circuits are made possible by processes that produce intricately patterned material layers on substrate surfaces. Producing patterned material on a substrate requires controlled methods for the removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. As a result of the diversity of materials, circuits, and processes, etch processes have been developed with a selectivity towards a variety of materials.

Bowing can occur while etching features with high aspect ratios such as 3D NAND flash memory. Significant bowing can lead to mechanical and/or structural instabilities in structures formed using the high aspect ratio features. Furthermore, significant bowing can cause the critical dimension between structures to be too wide to meet specifications for certain semiconductor designs. Similarly, significant bowing can cause the eventual semiconductor devices to be nonfunctional, lowering yields during the fabrication process.

Thus, there is a need for improved systems and methods that can be used to produce high quality devices and structures. These and other needs are addressed by the present technology.

SUMMARY

In some embodiments, a semiconductor processing method may include forming plasma effluents; contacting a carbon-containing hardmask and an oxide cap with the plasma effluents in a processing region of a semiconductor processing chamber, wherein a substrate is disposed on a substrate support within the processing region, wherein a plurality of alternating material layers overlays the substrate, wherein the oxide cap overlays the plurality of alternating material layers, and the carbon-containing hardmask overlays the oxide cap, wherein the carbon-containing hardmask has one or more apertures that allow the plasma effluents to access the oxide cap; and etching one or more features partially through the oxide cap through the one or more apertures of the carbon-containing hardmask with the plasma effluents to create a tapered profile for the one or more features characterized by a critical dimension at the bottom of the one or more features, wherein the critical dimension is less than or about 80% of a width of the one or more apertures.

In some embodiments, a semiconductor processing method may include forming plasma effluents of a carbon-and-fluorine-containing precursor; contacting a carbon-containing hardmask and an oxide cap with the plasma effluents in a processing region of a semiconductor processing chamber, wherein a substrate is disposed on a substrate support within the processing region, wherein a plurality of alternating material layers overlays the substrate, wherein the oxide cap overlays the plurality of alternating material layers, and the carbon-containing hardmask overlays the oxide cap, wherein the carbon-containing hardmask has one or more apertures that allow the plasma effluents to access the oxide cap; and etching one or more features partially through the oxide cap through the one or more apertures of the hardmask with the plasma effluents to create a tapered profile for the one or more features characterized by a critical dimension of less than or about 100 nm at the bottom of the one or more features.

In some embodiments, a semiconductor processing method may include forming plasma effluents of a carbon-and-fluorine-containing precursor; contacting a carbon-containing hardmask and an oxide cap with the plasma effluents in a processing region of a semiconductor processing chamber, wherein a substrate is disposed on a substrate support within the processing region, wherein a plurality of alternating material layers overlays the substrate, wherein the oxide cap overlays the plurality of alternating material layers, and the carbon-containing hardmask overlays the oxide cap, wherein the carbon-containing hardmask has one or more apertures that allow the plasma effluents to access the oxide cap; etching one or more features partially through the oxide cap through the one or more apertures of the hardmask with the plasma effluents to create a tapered profile for the one or more features characterized by a critical dimension at the bottom of the one or more features, wherein the tapered profile of the one or more features are characterized by a taper angle of less than or about 20 degrees; and etching the oxide cap and plurality of alternating material layers using a main etch such that the one or more features extend through both the oxide cap and the plurality of alternating material layers to form one or more channels.

In any embodiments, any and all of the following features may be implemented in any combination and without limitation. The critical dimension can be less than or about 70% of a width of the one or more apertures. The one or more features can be characterized by a critical dimension of less than or about 50 nm. The tapered profile of the one or more features can be characterized by a taper angle of less than or about 30 degrees. The semiconductor processing method can further include etching the one or more apertures in the carbon-containing hardmask to expose the oxide cap. The semiconductor processing method can further include etching one or more recesses in the oxide cap through the one or more apertures, wherein the one or more features are later formed inside the one or more recesses. The semiconductor processing method can further include etching the oxide cap and plurality of alternating material layers using a main etch such that the one or more features extend through both the oxide cap and the plurality of alternating material layers to form one or more channels. The one or more channels can define a first stack and a second stack A second critical dimension between the first stack and the second stack can be less than or about 130% of the critical dimension. The second critical dimension can be a maximum distance between the first stack and the second stack. The second critical dimension can be less than or about 65 nm. The one or more apertures can be characterized by a width of less than or about 100 nm. The carbon-and-fluorine-containing precursor can include $CF_4$. The plasma effluents can be generated at a plasma power of about 5000 W or less. A bias voltage of a power source of the semiconductor processing chamber can be about 5000 volts or less.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

Figure 1:
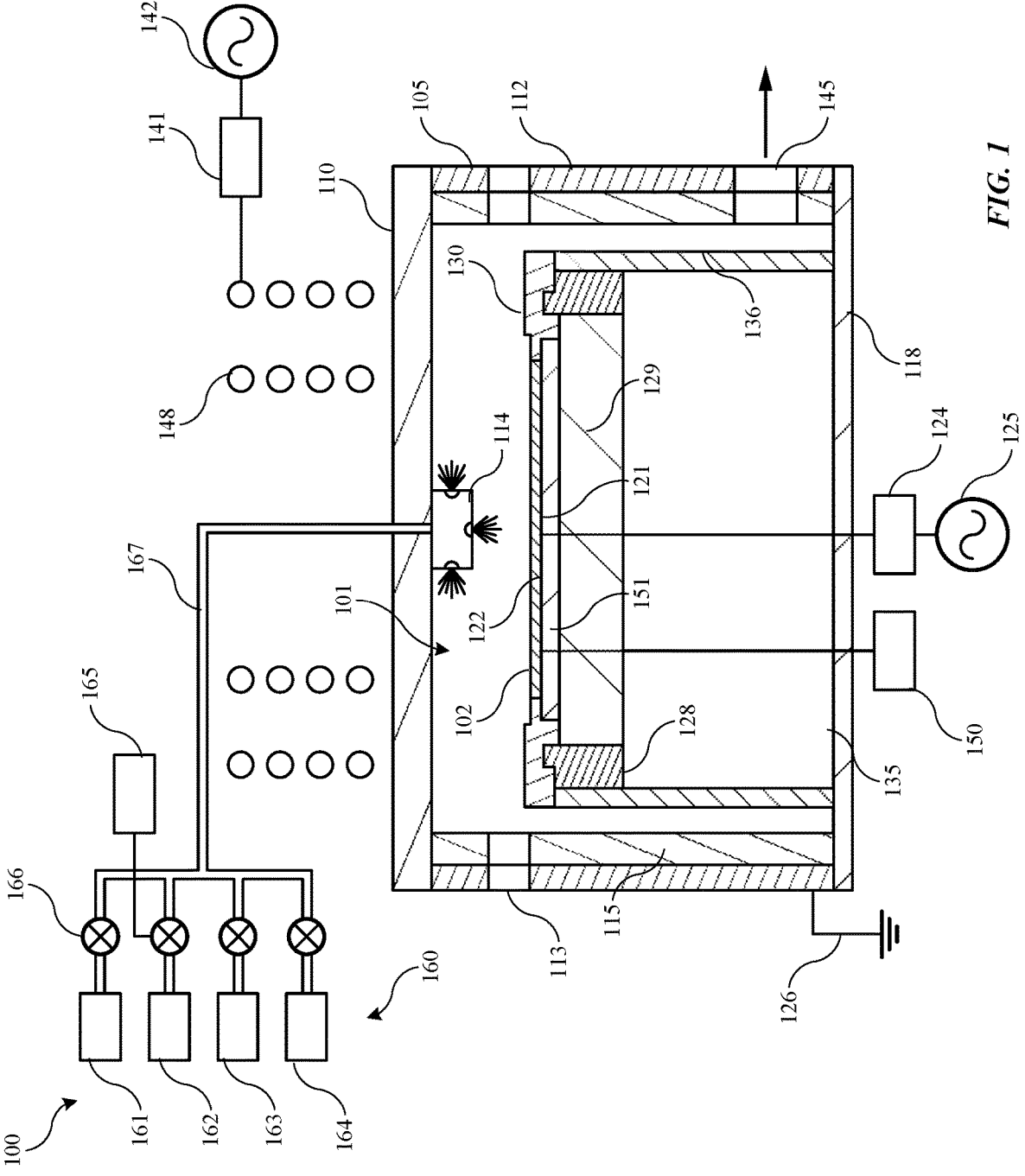
FIG. 1 shows a schematic cross-sectional view of an exemplary processing chamber according to some embodiments of the present technology.

Several of the figures are included as schematics. It is to be understood that the figures are for illustrative purposes and are not to be considered of scale unless specifically stated to be of scale. Additionally, as schematics, the figures are provided to aid comprehension and may not include all aspects or information compared to realistic representations and may include exaggerated material for illustrative purposes.

In the appended figures, similar components and/or features may have the same reference label. Further, various components of the same type may be distinguished by following the reference label with a letter that distinguishes among the similar components. If only the first reference label is used in the specification, the description applies to any one of the similar components having the same first reference label irrespective of the letter.

DETAILED DESCRIPTION

A breakthrough step between a carbon mask etch and a main channel hydrogen-and-fluorine-based etch for fabricating 3D NAND structures can be used to reduce bowing during the main channel etch. The breakthrough step can include a carbon-and-fluorine-based etch to create a tapered profile in an oxide cap between the carbon mask and the alternating layers of oxide and nitride in the 3D NAND structure. In some examples, the breakthrough step can be used to reduce a critical dimension in the oxide cap by 50% when compared to the critical dimension after the carbon mask etch. In some examples, the breakthrough step can be used to tune a critical dimension to a particular value to form stacks with a particular critical dimension during the main channel etch.

During the main channel etch of a 3D NAND fabrication process, channels are formed as high aspect ratio features. In conventional technologies, the main channel etch can cause bowing in the oxide and nitride layers which can increase a critical dimension between stacks. The increased critical dimension can reduce yields by causing mechanical and/or structural failure. Additionally, an increased critical dimension between stacks may preclude the use of particular designs and additional technologies in 3D NAND structures.

The present technology overcomes these issues by introducing a new step, the breakthrough step, during the process of 3D NAND fabrication. The breakthrough step can follow the carbon mask etch and can precede the main channel etch.

The breakthrough step can create a tapered profile in the oxide cap with a particular critical dimension, especially a critical dimension that is smaller than a prior critical dimension created in the oxide cap by the carbon mask etch. By creating a tapered profile with a smaller critical dimension in the oxide cap, the critical dimension in the oxide and nitride layers can be reduced and less bowing can occur. Additionally, forming a smaller critical dimension in the oxide cap can be used to control the critical dimension in the oxide and nitride layers such that the main channel etch can be tuned with less regard to the critical dimension in the oxide and nitride layers. In this way, parameters for the main channel etch can be focused on other design requirements than the critical dimension in the oxide and nitride layers. As such, the use of the breakthrough step can also lead to improvements in the main channel etch. The breakthrough step can include a forming plasma effluents from a carbon-and-fluorine-containing precursor to etch the oxide cap.

Although the remaining disclosure will routinely identify specific semiconductor processing methods utilizing the disclosed technology, and will describe one type of semiconductor processing chamber, it will be readily understood that the processes described may be performed in any number of semiconductor processing chambers. Accordingly, the technology should not be considered to be so limited as for use with these specific deposition processes or chambers alone. The disclosure will discuss one possible chamber that may be used to perform processes according to embodiments of the present technology before methods of semiconductor processing according to the present technology are described.

FIG. 1 illustrates a schematic cross-sectional view of an exemplary processing chamber 100 suitable for patterning a material layer disposed on a substrate 102 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 102 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 102 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. An example process gas is HF gas. Other examples of process gases that may be provided by the gas panel 160 include, but are not limited to, hydrocarbon containing gas including methane, silicon tetrafluoride, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gases may include nitrogen, chlorine, fluorine, oxygen, and hydrogen containing gases such as $H_2$, $NH_3$, $H_2O$, $H_2O_2$, $NF_3$, $F_2$, $CF_4$, $CHF_3$, $C_2F_6$, $C_2F_4$, $C_3F_6$, $C_4F_6$, $C_4F_8$, $BrF_3$, $ClF_3$, $SF_6$, $CH_3F$, $CH_2F_2$, $CHF_3$, $CF_3I$, $BCl_3$, $PF_3$, $PH_3$, $SO_2$, and COS, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 102 and/or above the substrate 102 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 102 during processing. The substrate support pedestal 135 may include an electrostatic chuck 122 for holding the substrate 102 during processing. The electrostatic chuck ("ESC") 122 may use the electrostatic attraction to hold the substrate 102 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 102 seated on the pedestal. The RF power supply 125 may cycle on and off, or pulse, during processing of the substrate 102. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 5000 volts to about −5,000 volts to the electrode 121. The power source 150 may also include a system controller for controlling the operation of the electrode 121 by directing a DC current to the electrode 121 for chucking and de-chucking the substrate 102. For example, similar to the RF power supply 125, power supply 150 may provide a bias which attracts plasma ions, formed by the process gases in the chamber volume 101, to the ESC 122 and substrate 102 seated on the pedestal. The power supply 150 may cycle on and off, or pulse, during processing of the substrate 102. In embodiments, the power supply 150 may supply RF power, DC current or voltage for chucking and/or bias, or a combination thereof. In additional embodiments, multiple power supplies may be configured to supply RF power and DC current or voltage for chucking and/or bias. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 102 disposed thereon. The ESC 122 may be configured to perform in the temperature range required by the thermal budget of the device being fabricated on the substrate 102. For example, the ESC 122 may be configured to maintain the substrate 102 at a temperature of about −150° C. or lower to about 500° C. or higher depending on the process being performed.

The cooling base 129 may be provided to assist in controlling the temperature of the substrate 102. To mitigate process drift and time, the temperature of the substrate 102 may be maintained substantially constant by the cooling base 129 throughout the time the substrate 102 is in the cleaning chamber. In some embodiments, the temperature of the substrate 102 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 102, while shielding the top surface of the substrate support pedestal 135 from the plasma environment inside the plasma processing chamber 100. Lift pins may be selectively translated through the substrate support pedestal 135 to lift the substrate 102 above the substrate support pedestal 135 to facilitate access to the substrate 102 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 2:
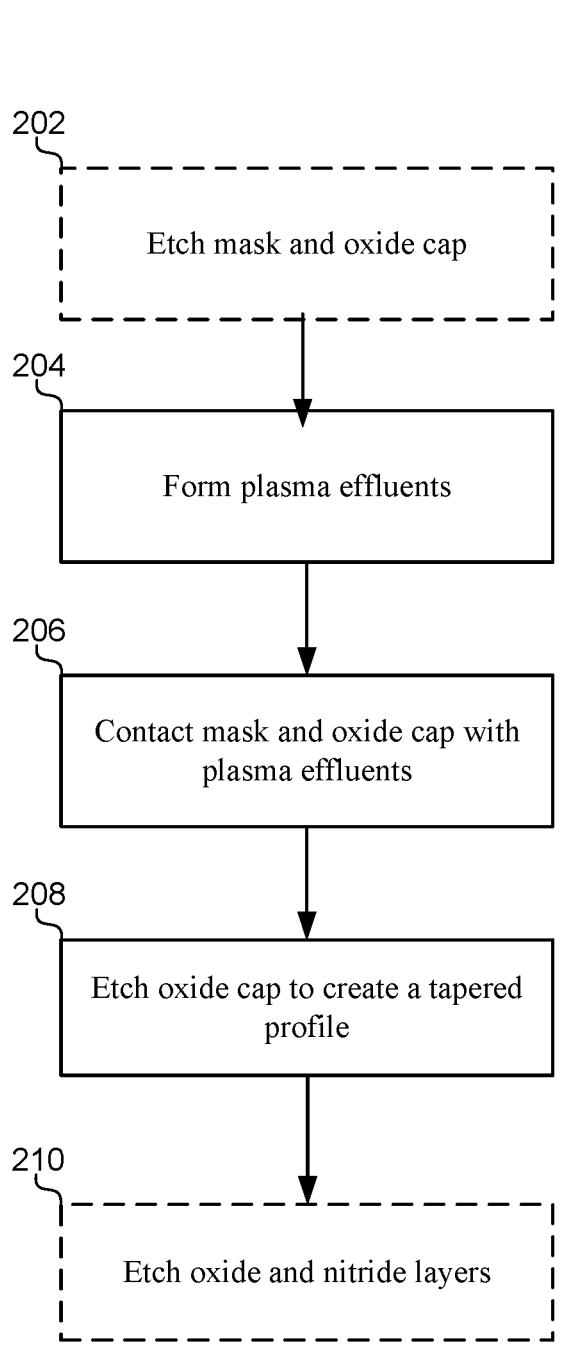
FIG. 2 shows operations in a semiconductor processing method according to some embodiments of the present technology.

The chambers discussed previously may be used in performing exemplary methods including etching methods and treatment methods. Turning to FIG. 2 is shown exemplary operations in method 200 according to embodiments of the present technology. Before the first operation of the method, a substrate may be processed in one or more ways (e.g, front-end processing, deposition, etching, polishing, cleaning, or any other operation) before being placed within a processing region of a chamber in which method 200 may be performed. Some or all of these operations may be performed in chambers or system tools as previously described or may be performed in different chambers on the same system tool, which may include the chamber in which the operations of method 200 are performed.

Figure 3A:
FIGS. 3A-3C show exemplary schematic cross-sectional structures produced according to some embodiments of the present technology.
Figure 3A:
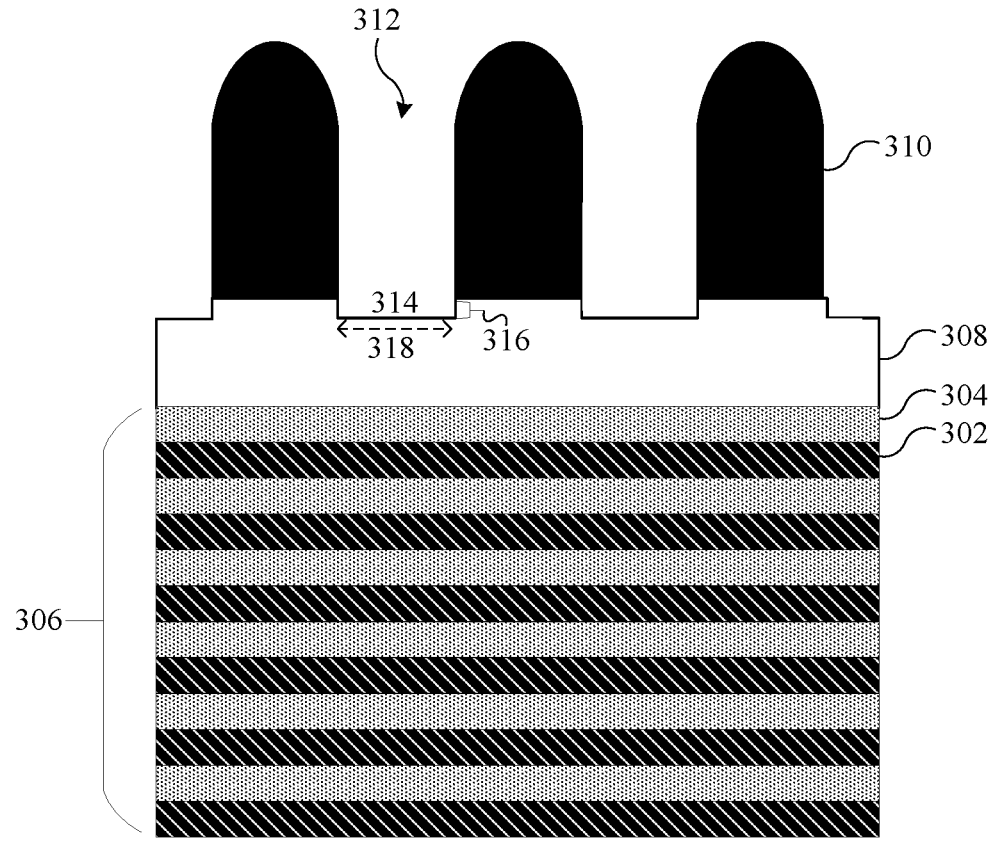
Figure 3B:
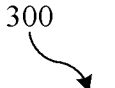
Figure 3B:
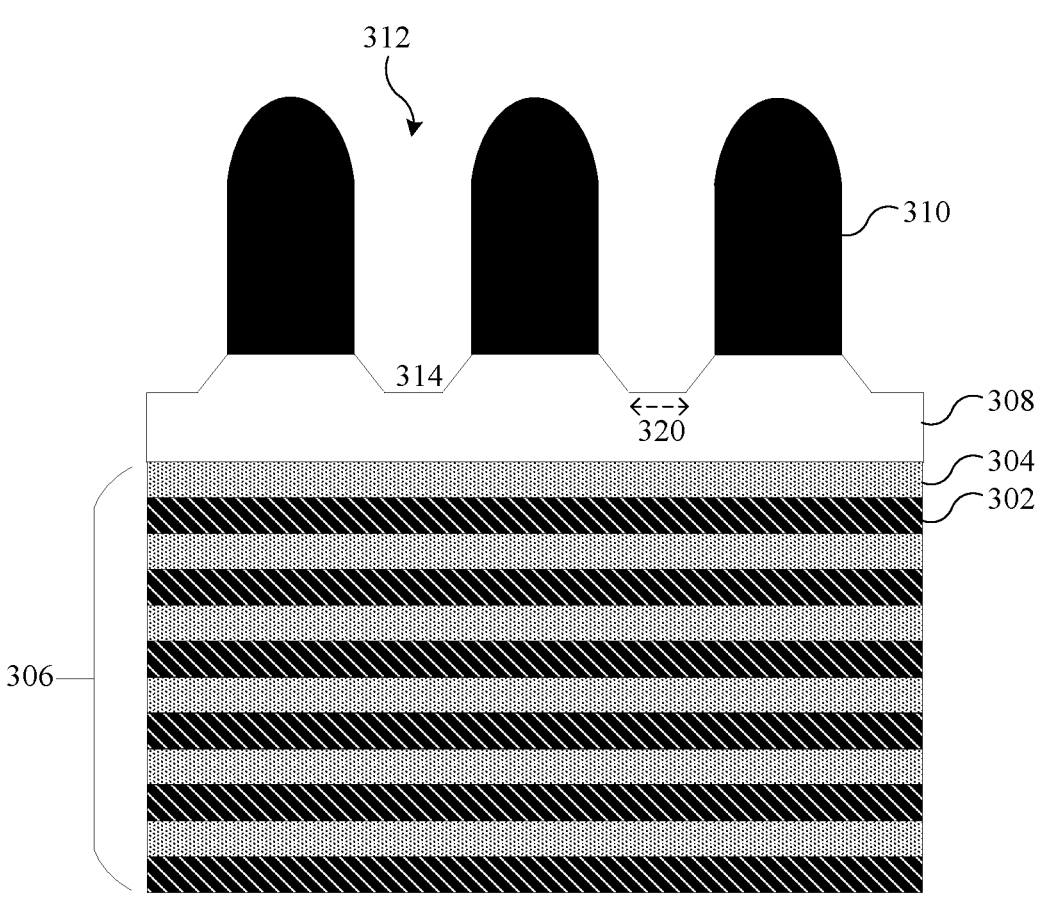
Figure 3C:
Figure 3C:
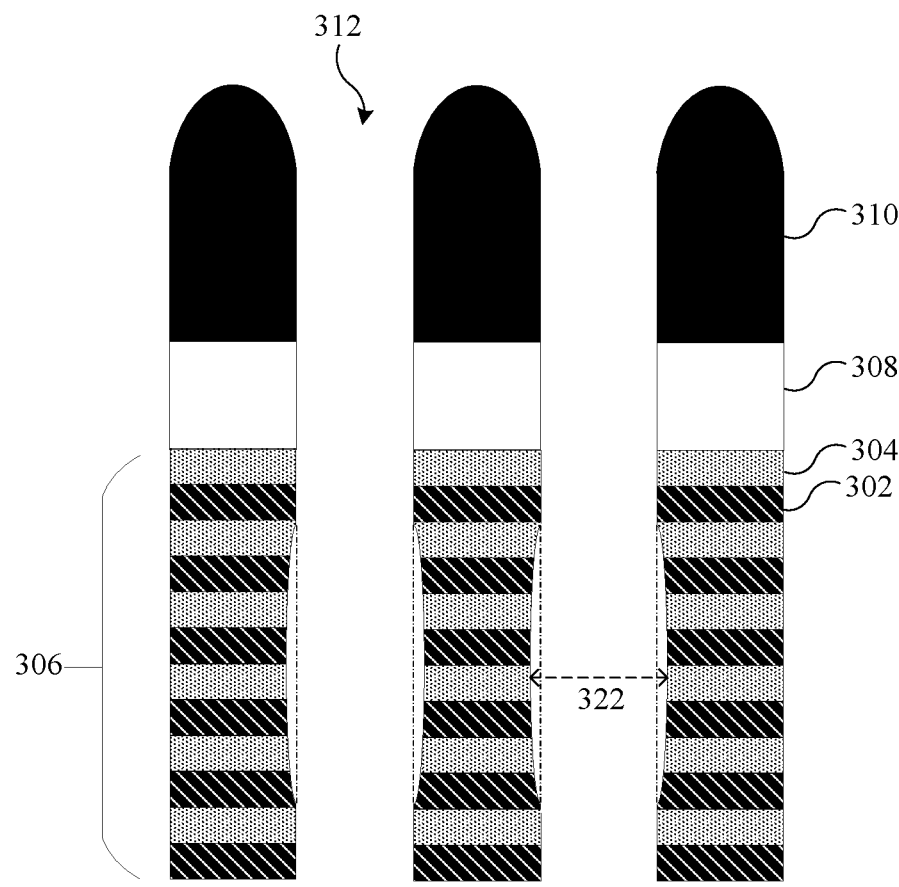

Method 200 may include several optional operations, which may or may not be specifically associated with some embodiments of methods according to the present technology. For example, many of the operations are described to provide a broader scope of the structural formation but are not critical to the technology or may be performed by alternative methodology as will be discussed further below. Method 200 describes operations shown schematically in FIGS. 3A-3C, the illustrations of which will be described in conjunction with the operations of method 200. It is to be understood that FIGS. 3A-3C illustrates only partial schematic views, and a substrate may contain any number of structural sections having aspects as illustrated in the figures, as well as alternative structural aspects that may still benefit from operations of the present technology.

Method 200 may or may not involve optional operations to develop the semiconductor structure 300 to a particular fabrication operation. It is to be understood that method 200 may be performed on any number of semiconductor structures 300, and FIG. 3A illustrates one exemplary structure within on which an etching process may be performed. As illustrated in FIG. 3A, a processed semiconductor structure 300 may include alternating material layers 306 of an oxide material 302 and a nitride material 304. An oxide cap 308 can overlay the alternating material layers 306. A mask 310 (which can also be referred to as a hardmask) can overlay the oxide cap 308. The alternating material layers can overlay a substrate in some examples.

The alternating material layers 306 can include an oxide material 302 and a nitride material 304. The oxide material 302 can be any type of oxide, for example silicon oxide, silicon oxynitride, and the like. The nitride material 304 can be any nitride, for example silicon nitride. In some examples, the oxide material 302 can have thicker layers than the nitride material 304. In some examples, the nitride material 304 can have thicker layers than the oxide material 302. In some examples, the alternating material layers 306 can be characterized by a thickness of less than or about 15000 nm, less than or about 14000 nm, less than or about 13000 nm, less than or about 12000 nm, less than or about 11000 nm, less than or about 10000 nm, less than or about 9000 nm, less than or about 8000 nm, less than or about 7000 nm, less than or about 6000 nm, less than or about 5000 nm, less than or about 4000 nm, less than or about 3000 nm, less than or about 2000 nm, less than or about 1000 nm, or less. In some examples, the alternating material layers 306 can be characterized by a thickness of greater than or about 1000 nm, greater than or about 2000 nm, greater than or about 3000 nm, greater than or about 4000 nm, greater than or about 5000 nm, greater than or about 6000 nm, greater than or about 7000 nm, greater than or about 8000 nm, greater than or about 9000 nm, greater than or about 10000 nm, greater than or about 11000 nm, greater than or about 12000 nm, greater than or about 13000 nm, greater than or about 14000 nm, greater than or about 15000 nm, or greater. In some examples, each layer of oxide material 302 can be characterized by a thickness of less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less. In some examples, each layer of nitride material 304 can be characterized by a thickness of less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less.

An oxide cap 308 can overlay the alternating material layers 306. The oxide cap 308 can be any type of oxide. In some examples, the oxide cap 308 can be silicon oxide. In some examples, the oxide cap 308 can overlay an oxide material 302 of the alternating material layers 306. In some examples, the oxide cap 308 can overlay a nitride material 304 of the alternating material layers 306. In some examples, the oxide cap can be characterized by a thickness of less than or about 300 nm, less than or about 290 nm, less than or about 280 nm, less than or about 270 nm, less than or about 260 nm, less than or about 250 nm, less than or about 240 nm, less than or about 230 nm, less than or about 220 nm, less than or about 210 nm, less than or about 200 nm, less than or about 190 nm, less than or about 180 nm, less than or about 170 nm, less than or about 160 nm, less than or about 150 nm, less than or about 140 nm, less than or about 130 nm, less than or about 120 nm, less than or about 110 nm, less than or about 100 nm, less than or about 90 nm, less than or about 80 nm, less than or about 70 nm, less than or about 60 nm, less than or about 50 nm, or less.

A mask 310 can overlay the oxide cap 308. The mask 310 can be a carbon-containing mask. The mask 310 can be a hardmask. The mask 310 can be silicon carbide, amorphous carbon, or any other type of carbon-containing mask. In some examples, the mask 310 can be characterized by a thickness of less than or about 5000 nm, less than or about 4900 nm, less than or about 4800 nm, less than or about 4700 nm, less than or about 4600 nm, less than or about 4500 nm, less than or about 4400 nm, less than or about 4300 nm, less than or about 4200 nm, less than or about 4100 nm, less than or about 4000 nm, less than or about 3900 nm, less than or about 3800 nm, less than or about 3700 nm, less than or about 3600 nm, less than or about 3500 nm, less than or about 3400 nm, less than or about 3300 nm, less than or about 3200 nm, less than or about 3100 nm, less than or about 3000 nm, less than or about 2900 nm, less than or about 2800 nm, less than or about 2700 nm, less than or about 2600 nm, less than or about 2500 nm, less than or about 2400 nm, less than or about 2300 nm, less than or about 2200 nm, less than or about 2100 nm, less than or about 2000 nm, or less.

The semiconductor structure 300 of FIG. 3A can result from a mask etch of the mask 310. For example, a mask etch can etch the mask 310 and the oxide cap 308 to form one or more apertures 312 in the mask 310 as shown in FIG. 3A. The mask etch can also expose the oxide cap 308 and form one or more features 314 in the oxide cap 308 by etching the oxide cap 308. The one or more features 314 can be characterized by a depth 316 and a critical dimension 318. In some examples, the critical dimension 318 can be the substantially the same width as the distance between adjacent portions of the mask 310. In some examples, the critical dimension 318 can be substantially the width of the one or more apertures 312. In some examples, the one or more features 314 may not be deep enough from the mask etch that the alternating material layers 306 are exposed. In some examples, the critical dimension 318 can be characterized by a width of less than or about 200 nm, less than or about 190 nm, less than or about 180 nm, less than or about 170 nm, less than or about 160 nm, less than or about 150 nm, less than or about 140 nm, less than or about 130 nm, less than or about 120 nm, less than or about 110 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less. In some examples, the depth 316 can be characterized by a depth less than or about 110 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less.

Operation 202 can be an optional operation of method 200. In some examples, method 200 can begin with operation 202. Operation 202 can include etching the mask 310 and the oxide cap 308 with a mask etch. The mask etch can etch the mask 310 and the oxide cap 308 to form the one or more apertures 312 and the one or more features 314. The mask etch can include any suitable material for etching carbon-containing materials. In some examples, the mask etch can be a plasma etch, a wet etch, a dry etch, or any other suitable etch.

In some examples, method 200 can begin with operation 204. At operation 204, method 200 may include forming plasma effluents 350 of a carbon-and-fluorine-containing precursor. In some examples, the method 200 can begin with operation 204. In some examples, the method can begin with operation 202. For example, the carbon-and-fluorine-containing precursor may include CF$_4$, CHF$_3$, C$_2$F$_6$, C$_2$F$_4$, C$_3$F$_6$, C$_4$F$_6$, C$_4$F$_8$, CH$_3$F, CH$_2$F$_2$, CHF$_3$, and CF$_3$I. In some examples, the breakthrough step can be referred to as starting with operation 204 and ending with operation 208.

The plasma effluents formed from the carbon-and-fluorine-containing precursor may be formed locally in the processing region or in a remote plasma system. That is, the plasma effluents may be produced in the processing region of the semiconductor processing chamber housing the semiconductor structure 300. Alternatively, the plasma effluents may be produced remotely and provided to the processing region of the semiconductor processing chamber housing the semiconductor structure 300. For example, the plasma treatment may be generated by a remote plasma source (RPS), a capacitively coupled plasma (CCP), or an inductively coupled plasma (ICP) with or without one or more carrier gases such as argon (Ar), helium (He), NH$_3$, nitrogen (N$_2$), H$_2$, or mixtures thereof. The plasma effluents may be a low-level plasma to limit the amount of bombardment, sputtering, and surface modification. In embodiments, the plasma power may be less than or about 5,000 W, less than or about 4,750 W, less than or about 4,500 W, less than or about 4,250 W, less than or about 4,000 W, less than or about 3,750 W, less than or about 3,500 W, less than or about 3,000 W, less than or about 2,750 W, less than or about 2,500 W, less than or about 2,250 W, less than or about 2,000 W, less than or about 1,750 W, less than or about 1,500 W, less than or about 1,250 W, less than or about 1,000 W, or less, although the plasma power may also be included in ranges between any two of these stated numbers or within any smaller range encompassed by any of the stated ranges. By utilizing a low-level plasma power, the plasma effluents may be better controlled for delivery through the apertures 312 of the mask 310, while limiting sputtering of the mask 310 as well as other exposed surfaces.

During operation 204, the volumetric ratio of the carbon-and-fluorine-containing precursors relative to the other gases may be less than or about 20:1. In some examples, the volumetric ratio of the hydrogen-and-fluorine-containing precursors relative to the other gases may be less than or about 15:1, less than or about 10:1, less than or about 5:1, less than or about 4:1, less than or about 3:1, less than or about 2:1, less than or about 1:1, or ranges of volumetric ratios such as 1:1 to 20:1, 10:1 to 15:1, or 1:1 to 5:1. In some examples, there may be substantially no other gases during the formation of the plasma effluents. In some examples, one or more carrier gases are present when forming the plasma effluents. The volumetric ratio of the hydrogen-and-fluorine-containing precursor can affect the corresponding critical dimension 320. For example, increasing the hydrogen-and-fluorine-containing precursor volumetric ratio can lead to a smaller critical dimension 320.

At operation 206, method 200 may include contacting the hardmask 310 and the oxide cap 308 with the plasma effluents in the processing region of the semiconductor processing chamber. At operation 208, the contacting of the oxide cap 308 with the plasma effluents may cause etching of the oxide cap 308, as illustrated in FIG. 3B. Etching the oxide cap 308 (and potentially other layers) can be referred to as the breakthrough step or the breakthrough etch. The plasma effluents can etch a tapered profile into the oxide cap 308 with a critical dimension 320 at the bottom of the tapered profile of the one or more features 314 in the oxide cap 308. The critical dimension 320 can be smaller than the width of the one or more apertures 312 and/or the width of the one or more features at the top of the oxide cap 308. In some examples, the hardmask 310 can also be etched by the plasma effluents. In some examples, the oxide cap 308 can be etched such that the alternating material layers 306 are not exposed. In some examples the oxide cap 308 is etched such that the alternating material layers 306 are not etched. In some examples, the oxide cap 308 can be etched such that the one or more features 314 do not extend through the oxide cap 308. In some examples, the oxide cap 308 can be etched such that the one or more features 314 expose the alternating material layers 306. In some examples, the breakthrough etch can extend the one or more features 314 into the alternating material layers 306 such that the critical dimension 320 can be formed by etching the alternating material layers 306. The etch time for operation 208 can affect the corresponding critical dimension 320. For example, increasing the etch time can lead to a smaller critical dimension 320.

In some examples, the critical dimension 320 can be characterized as a percentage size of the one or more apertures 312 and/or the width of the one or more features at the top of the oxide cap 308. In some examples, the critical dimension 320 can be characterized as a percentage of the width of the one or more apertures 312 and/or the width of the one or more features at the top of the oxide cap 308 such that the critical dimension 320 is less than or about 95% of the width of the one or more apertures 312, and/or the width of the one or more features at the top of the oxide cap 308, less than or about 90%, less than or about 85%, less than or about 80%, less than or about 75%, less than or about 70%, less than or about 65%, less than or about 60%, less than or about 55%, less than or about 50%, less than or about 45%, less than or about 40%, less than or about 35%, less than or about 30%, less than or about 25%, less than or about 20%, less than or about 15%, less than or about 10%, less than or about 5%, or less. The percentage may range from between 5% and 95%, or any subrange combination therein (for example, 32-58%), or any percentage between (for example, 6.2% and 83.9%).

In some examples, the critical dimension 320 can be characterized by a width. In some examples, the critical dimension 320 can be characterized by a width of less than or about 200 nm, less than or about 190 nm, less than or about 180 nm, less than or about 170 nm, less than or about 160 nm, less than or about 150 nm, less than or about 140 nm, less than or about 130 nm, less than or about 120 nm, less than or about 110 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less. The width may range from between 10 nm and 200 nm, or any subrange combination therein (for example, 73 nm to 144 nm), or any value between (for example, 27 nm and 166 nm).

In some examples, the critical dimension 320 can be characterized by a reduction in width compared to the width of the one or more apertures 312 and/or the width of the one or more features at the top of the oxide cap 308. In some examples, the critical dimension 320 can be characterized by a reduction in width of compared to the width of the one or more apertures 312 and/or the width of the one or more features at the top of the oxide cap 308 of less than or about 200 nm, less than or about 190 nm, less than or about 180 nm, less than or about 170 nm, less than or about 160 nm, less than or about 150 nm, less than or about 140 nm, less than or about 130 nm, less than or about 120 nm, less than or about 110 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less. The reduction in width compared to the width of the one or more apertures 312 and/or the width of the one or more features at the top of the oxide cap 308 may range from between 10 nm and 200 nm, or any subrange combination therein (for example, 73 nm to 144 nm), or any value between (for example, 27 nm and 166 nm).

In some examples, the tapered profile of the one or more features 314 can be characterized by a taper angle relative to the bottom of the tapered profile of the one or more features 314 in the oxide cap 308. In some examples, the taper angle relative to the bottom of the tapered profile of the one or more features 314 in the oxide cap 308 can be characterized by an angle of about or less than 85 degrees, about or less than 80 degrees, about or less than 75 degrees, about or less than 70 degrees, about or less than 65 degrees, about or less than 60 degrees, about or less than 55 degrees, about or less than 50 degrees, about or less than 45 degrees, about or less than 40 degrees, about or less than 35 degrees, about or less than 30 degrees, about or less than 25 degrees, about or less than 20 degrees, about or less than 15 degrees, about or less than 10 degrees, about or less than 5 degrees, or less. The angle may range from between 5 degrees and 85 degrees, or any subrange combination therein (for example, 42 degrees to 66 degrees), or any angle between (for example, 33 degrees and 72 degrees).

Operation 210 can be an optional operation of method 200. At operation 210, the oxide, cap, and the oxide material 302 and the nitride 304 of the alternating material layers 306 can be etched. For example, a main etch (also referred to as a main channel etch) can be used to etch through the oxide cap 308, and the oxide material 302 and the nitride 304 of the alternating material layers 306. The main etch can be a hydrogen-and-fluorine-based etch. In some examples, the main etch can be a plasma etch, a wet etch, a dry etch, or any other suitable etch. After the main etch has been applied to the semiconductor structure 300, the one or more features 312 can extend through the mask 310, the oxide cap 308, and the alternating material layers 306 to form one or more channels. The one or more channels can be characterized by a high aspect ratio of depth to width such that the depth is significant compared to the width of the channel. For example, the aspect ratio depth to width of the one or more channels may be greater than or about 10:1, greater than or about 20:1, greater than or about 30:1, greater than or about 40:1, greater than or about 50:1, or greater. In some examples, the one or more channels can be characterized by bowing between the alternating material layers 306 of adjacent stacks. Bowing can refer to a dish shaped horizontal recess along the sides of the channels in the alternating material layers 306. A horizontal recess can be characterized with a bowing depth from the plane of the channel to the most recessed point of the horizontal recess. A critical dimension 322 between the most recessed points of adjacent horizontal recesses can be used to characterize the channel. The breakthrough step described above can cause the critical dimension 322 to be smaller. For example, for every 1 nm of tapering from the top of the feature 314 to the critical dimension 320 during operation 208 (for example, tapering can refer to the difference between the width of the top of the feature 314 and the critical dimension 320), the critical dimension 322 can be reduced by less than or about 1 nm. In some examples, every 1 nm of tapering from the from the top of the feature 314 to the critical dimension 320 during operation 208 can reduce the critical dimension 322 by less than or about 0.9 nm, less than or about 0.8 nm, less than or about 0.7 nm, less than or about 0.6 nm. In some examples, every 1 nm of tapering from the from the top of the feature 314 to the critical dimension 320 during operation 208 can reduce the critical dimension 322 by greater than or about 1 nm, greater than or about 1.1 nm, greater than or about 1.2 nm, greater than or about 1.3 nm, greater than or about 1.4 nm, greater than or about 1.5 nm, greater than or about 1.6 nm, greater than or about 1.7 nm, greater than or about 1.8 nm, greater than or about 1.9 nm, greater than or about 2.0 nm, or greater.

In some examples, the critical dimension 322 can be characterized as a percentage size of the one or more apertures 312 and/or the width of the one or more features at the top of the oxide cap 308. In some examples, the critical dimension 322 can be characterized as a percentage of the width of the one or more apertures 312 and/or the width of the one or more features at the top of the oxide cap 308 such that the critical dimension 320 is less than or about 200% of the width of the one or more apertures 312 and/or the width of the one or more features at the top of the oxide cap 308, less than or about 195%, less than or about 190%, less than or about 185%, less than or about 180%, less than or about 175%, less than or about 170%, less than or about 165%, less than or about 160%, less than or about 155%, less than or about 150%, less than or about 145%, less than or about 140%, less than or about 135%, less than or about 130%, less than or about 125%, less than or about 120%, less than or about 115%, less than or about 110%, less than or about 105%, less than or about 100%, or less. The percentage may range from between 100% and 130%, or any subrange combination therein (for example, 102-107%), or any percentage between (for example, 113% and 104%).

In some examples, the critical dimension 322 can be characterized by a width. In some examples, the critical dimension 322 can be characterized by a width of less than or about 250 nm, less than or about 240 nm, less than or about 230 nm, less than or about 220 nm, less than or about 210 nm, less than or about 200 nm, less than or about 190 nm, less than or about 180 nm, less than or about 170 nm, less than or about 160 nm, less than or about 150 nm, less than or about 140 nm, less than or about 130 nm, less than or about 120 nm, less than or about 110 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less. The width may range from between 10 nm and 250 nm, or any subrange combination therein (for example, 48 nm to 212 nm), or any value between (for example, 63 nm and 222 nm).

In some examples, the critical dimension 322 can be characterized by difference in width from the width one or more apertures 312 and/or the width of the one or more features at the top of the oxide cap 308. The critical dimension 322 can be larger than the width one or more apertures 312 and/or the width of the one or more features at the top of the oxide cap 308. In some examples, the critical dimension 322 can be characterized by a difference in width from the width one or more apertures 312 and/or the width of the one or more features at the top of the oxide cap 308 of less than or about 250 nm, less than or about 240 nm, less than or about 230 nm, less than or about 220 nm, less than or about 210 nm, less than or about 200 nm, less than or about 190 nm, less than or about 180 nm, less than or about 170 nm, less than or about 160 nm, less than or about 150 nm, less than or about 140 nm, less than or about 130 nm, less than or about 120 nm, less than or about 110 nm, less than or about 100 nm, less than or about 90 nm, less than or about 80 nm, less than or about 70 nm, less than or about 60 nm, less than or about 50 nm, less than or about 40 nm, less than or about 30 nm, less than or about 20 nm, less than or about 10 nm, or less. The difference in width from the width one or more apertures 312 and/or the width of the one or more features at the top of the oxide cap 308 may range from between 10 nm and 250 nm, or any subrange combination therein (for example, 10 nm to 30 nm), or any value between (for example, 66 nm and 213 nm).

During any operation 204, 206, and/or 208 of method 200, a bias voltage may be applied to the semiconductor structure 300. In some examples, the bias voltage can be less than or about 5,000 V, less than or about 4,500 V, less than or about 4,000 V, less than or about 3,500 V, less than or about 3,000 V, less than or about 2,500 V, less than or about 2,000 V, less than or about 1,500 V, less than or about 1,000 V, or less, although the chucking voltage may also be included in ranges between any two of these stated numbers or within any smaller range encompassed by any of the stated ranges. The bias voltage can affect the critical dimension 320. For example, lowering the bias voltage can lead to a smaller critical dimension 320.

During any operation 204, 206, and/or 208 of method 200, a chucking voltage of the power source may be applied to the semiconductor structure 300. In some examples, the chucking voltage can be less than or about 5,000 V, less than or about 4,500 V, less than or about 4,000 V, less than or about 3,500 V, less than or about 3,000 V, less than or about 2,500 V, less than or about 2,000 V, less than or about 1,500

V, less than or about 1,000 V, or less, although the bias voltage may also be included in ranges between any two of these stated numbers or within any smaller range encompassed by any of the stated ranges.

Each of the operations of method 200 may be performed during a constant temperature in embodiments, while in some embodiments the temperature may be adjusted during different operations. For example, the substrate, pedestal, or chamber temperature during method 200 may be maintained at a temperature less than or about 100° C., less than or about 90° C., less than or about 80° C., and in some embodiments the temperature may be maintained less than or about 70° C., less than or about 60° C., less than or about 50° C., less than or about 30° C., less than or about 20° C., less than or about 10° C., less than or about 0° C., less than or about −10° C., less than or about −20° C., less than or about −30° C., less than or about −40° C., less than or about −50° C., or less. The temperature may range from between 100° C. and −50° C., or any subrange combination therein (for example, 20° C. to 40° C.), or any value between (for example, −7° C. and 31° C.).

The pressure within the processing chamber may be controlled during method 200. For example, while forming the local plasma and performing the removal operation, the pressure within the processing chamber may be maintained below or about 1 Torr. Additionally, in embodiments, the pressure within the processing chamber may be maintained below or about 1 Torr, below or about 500 mTorr, below or about 250 mTorr, below or about 200 mTorr, below or about 150 mTorr, below or about 100 mTorr, below or about 95 mTorr, below or about 90 mTorr, below or about 85 mTorr, below or about 80 mTorr, below or about 75 mTorr, below or about 705 mTorr, below or about 65 mTorr, below or about 60 mTorr, below or about 55 mTorr, below or about 50 mTorr, below or about 45 mTorr, below or about 40 mTorr, below or about 35 mTorr, below or about 30 mTorr, below or about 25 mTorr, below or about 20 mTorr, below or about 15 mTorr, below or about 10 mTorr, below or about 5 mTorr, below or about 4 mTorr, below or about 3 mTorr, below or about 2 mTorr, below or about 1 mTorr, or lower. The pressure may range from between 1 mTorr to 1 Torr, or any subrange combination therein (for example, 5 m Torr to 100 mTorr), or any value between (for example, 650 mTorr and 8 mTorr). The pressure within the processing chamber may affect the capabilities of flow into the aperture. For example, as pressure increases, plasma effluents may have increased difficulty in permeating the aperture 320 to reach the hardmask 315. Accordingly, in some embodiments, the pressure may be maintained below or about 30 mTorr to allow effluent flow into the aperture 320 and the feature 355 being etched in the hardmask 315 on the organic material 310.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing method comprising:
forming plasma effluents;
contacting a carbon-containing hardmask and an oxide cap with the plasma effluents in a processing region of a semiconductor processing chamber, wherein a substrate is disposed on a substrate support within the processing region, wherein a plurality of alternating material layers overlays the substrate, wherein the oxide cap overlays the plurality of alternating material layers, and the carbon-containing hardmask overlays the oxide cap, wherein the carbon-containing hardmask has one or more apertures that allow the plasma effluents to access the oxide cap; and
etching one or more features partially through the oxide cap through the one or more apertures of the carbon-containing hardmask with the plasma effluents to create a tapered profile for the one or more features characterized by a critical dimension at the bottom of the one or more features, wherein the critical dimension is less than or about 80% of a width of the one or more apertures.

2. The semiconductor processing method of claim 1, wherein the critical dimension is less than or about 70% of a width of the one or more apertures.

3. The semiconductor processing method of claim 1, wherein the one or more features are characterized by a critical dimension of less than or about 50 nm.

4. The semiconductor processing method of claim 1, wherein the tapered profile of the one or more features are characterized by a taper angle of less than or about 30 degrees.

5. The semiconductor processing method of claim 1, further comprising:

etching the one or more apertures in the carbon-containing hardmask to expose the oxide cap; and
etching one or more recesses in the oxide cap through the one or more apertures, wherein the one or more features are later formed inside the one or more recesses.

6. The semiconductor processing method of claim 1, further comprising:
etching the oxide cap and plurality of alternating material layers using a main etch such that the one or more features extend through both the oxide cap and the plurality of alternating material layers to form one or more channels.

7. The semiconductor processing method of claim 6, wherein the one or more channels define a first stack and a second stack, and wherein a second critical dimension between the first stack and the second stack is less than or about 130% of the critical dimension.

8. The semiconductor processing method of claim 7, wherein the second critical dimension is a maximum distance between the first stack and the second stack.

9. The semiconductor processing method of claim 8, wherein the second critical dimension is less than or about 65 nm.

10. The semiconductor processing method of claim 1, wherein the oxide cap has a thickness of less than or about 100 nm.

11. The semiconductor processing method of claim 1, wherein the one or more apertures are characterized by a width of less than or about 100 nm.

12. The semiconductor processing method of claim 1, wherein a carbon-and-fluorine-containing precursor is used to form the plasma effluents.

13. The semiconductor processing method of claim 12, wherein the carbon-and-fluorine-containing precursor comprises $CF_4$.

14. The semiconductor processing method of claim 1, wherein the plasma effluents are generated at a plasma power of about 5000 W or less.

15. The semiconductor processing method of claim 1, wherein a bias voltage of a power source of the semiconductor processing chamber is about 5000 volts or less.

16. A semiconductor processing method comprising:
forming plasma effluents of a carbon-and-fluorine-containing precursor;
contacting a carbon-containing hardmask and an oxide cap with the plasma effluents in a processing region of a semiconductor processing chamber, wherein a substrate is disposed on a substrate support within the processing region, wherein a plurality of alternating material layers overlays the substrate, wherein the oxide cap overlays the plurality of alternating material layers, and the carbon-containing hardmask overlays the oxide cap, wherein the carbon-containing hardmask has one or more apertures that allow the plasma effluents to access the oxide cap; and
etching one or more features partially through the oxide cap through the one or more apertures of the hardmask with the plasma effluents to create a tapered profile for the one or more features characterized by a critical dimension of less than or about 100 nm at the bottom of the one or more features.

17. The semiconductor processing method of claim 16, further comprising:
forming the carbon-containing hardmask overlaying the oxide cap;

etching the one or more apertures in the carbon-containing hardmask to expose the oxide cap, wherein the one or more apertures are characterized by a width of less than or about 120 nm; and partially etching the oxide cap to form the one or more features.

18. A semiconductor processing method comprising:

forming plasma effluents of a carbon-and-fluorine-containing precursor;

contacting a carbon-containing hardmask and an oxide cap with the plasma effluents in a processing region of a semiconductor processing chamber, wherein a substrate is disposed on a substrate support within the processing region, wherein a plurality of alternating material layers overlays the substrate, wherein the oxide cap overlays the plurality of alternating material layers, and the carbon-containing hardmask overlays the oxide cap, wherein the carbon-containing hardmask has one or more apertures that allow the plasma effluents to access the oxide cap;

etching one or more features partially through the oxide cap through the one or more apertures of the hardmask with the plasma effluents to create a tapered profile for the one or more features characterized by a critical dimension at the bottom of the one or more features, wherein the tapered profile of the one or more features are characterized by a taper angle of less than or about 20 degrees; and etching the oxide cap and plurality of alternating material layers using a main etch such that the one or more features extend through both the oxide cap and the plurality of alternating material layers to form one or more channels.

19. The semiconductor processing method of claim 18, wherein the one or more features are characterized by a critical dimension of less than or about 90% of a width of the one or more apertures.

20. The semiconductor processing method of claim 18, wherein the one or more channels define a first stack and a second stack, and wherein a second critical dimension between the first stack and the second stack is less than or about 100 nm.

* * * * *